United States Patent [19]
Shefer

[11] Patent Number: 5,850,357
[45] Date of Patent: Dec. 15, 1998

[54] SIGNAL PROCESSING DEVICE

[76] Inventor: Mordechai Shefer, 16 Gut Levin Street, Haifa 32922, Israel

[21] Appl. No.: 737,780
[22] PCT Filed: May 26, 1995
[86] PCT No.: PCT/US95/06780
  § 371 Date: Nov. 25, 1996
  § 102(e) Date: Nov. 25, 1996
[87] PCT Pub. No.: WO95/33306
  PCT Pub. Date: Dec. 7, 1995

[30] Foreign Application Priority Data

May 30, 1994 [IL] Israel ......................................... 109824

[51] Int. Cl.⁶ ....................................................... G06G 7/02
[52] U.S. Cl. ............................................. 364/825; 364/602
[58] Field of Search .................................... 328/678, 671;
364/825, 807

[56] References Cited

U.S. PATENT DOCUMENTS 4,063,200 12/1977 Mattern .
4,417,317 11/1983 White et al. .

FOREIGN PATENT DOCUMENTS 0 223 295 5/1987 European Pat. Off. .
63-266983 11/1988 Japan .

OTHER PUBLICATIONS

Grant et al, "Recent Advances in Analog Signal Processing" IEEE Trans. on Aerospace and Electronic Sys., vol. 26, No. 5 pp. 818–849, Sep., 1, 1990.

Primary Examiner—Tan V. Mai
Attorney, Agent, or Firm—Kane, Dalsimer, Sullivan, Kurucz, Levy, Eisele and Richard, LLP

[57] ABSTRACT

A real time equalizer-enhancer apparatus, comprises: a plurality of analog multipliers (33) having one input (X) connected to the sampled input signal, and the other (Y) input connected to the output of an operational amplifier (34); at least one operational amplifier provided with feedback resistor (35), the output of which is connected to the input of one or more of the said plurality of analog multipliers, and the input of which is connected to one or more summing resistor, and a plurality of summing resistor; (36) connected between the output of each of the said analog multipliers (33) and the input of the operational amplifier (34); means being provided to combine the outputs of the said plurality of analog multipliers according to a predetermined combination rule, means also being provided to subtract said combination of multipliers outputs from prescribed constant bias values, and to feed the results back into the inputs of the analog multipliers (33).

10 Claims, 8 Drawing Sheets

SIGNAL PROCESSING DEVICE

FIELD OF THE INVENTION

The present invention relates generally to signal processing, and more specifically to apparatus for carrying out the equalization and enhancement of audio and video signals via a dynamic range reduction which is performed by a non-causal feedback automatic gain control (AGC) algorithm.

BACKGROUND OF THE INVENTION

The dynamic range (DR) of a signal is determined by the ratio between the maximum value that the signal may possess, and the minimum significant difference between any pair of samples within the signal. Hence, the signal DR defines how many distinct levels of intensity a subsequent user of the signal must have, in order to fully exploit the information conveyed by the signal. The DR is a major factor in the cost of processors, data storages, and data communication links. The DR of media and displays such as loudspeakers, electronic picture-tubes and picture-paper is physically limited. Typical limitation of visual media is 256 distinct levels, while some state of the art sensors have output signal DR that approach $10^5$. Many details of meaningful information of such high DR signals will be lost when displayed on a picture-tube or on paper.

The DR of light intensities in natural views and scenarios may exceed $10^{10}$. It has been known for a long time that the eyes of animals, as well as the human eye, are capable of reducing the DR of detected light signals by many orders of magnitudes. Some signal processing performed in biological sensors such as the eye, have been successfully modeled by a spatial, or non-causal feedback AGC algorithm, whose block diagram is schematically given in FIG. 1. In this model the input signal is multiplied by a difference of a constant and a non-causal average of the output signal. As a result, the transmission of this model to the average level of the input signal exhibits a logarithmic nature, according to curve A of FIG. 2. Due to the average logarithmic transmission, the average level of the output signal cannot exceed a prescribed constant value, despite an arbitrary increase in the input average level. Simultaneously, The transmission of the same model has the trend to enhance local variations in the input signal, according to curves B of FIG. 2. The combined result of these two different responses of the said AGC model is a decrease of the signal dynamic range which is obtained without any apparent loss of information. This double-role operation is termed "Equalization-Enhancement".

THE PRIOR ART

The generalized approximation of the said model constitutes the class of neighborhood transforms which actually cover many known signal processing techniques, such as convolution. Signal processing generally consists of three phases: preprocessing, data reduction, and recognition. At the preprocessing phase, the complete signal is usually processed by algorithms which are unaware of the content of the signal, and merely improve its quality. Examples are histogram equalization, noise reduction, peak detection, smoothing, thresholding, etc.

The preprocessing phase of signal processing requires the handling of a huge flow of information. Many preprocessing algorithms operate on small neighborhoods or segments of the signal at a time, while others, such as histogram processing and certain integral transforms, process the whole signal before any result can be generated. Some preprocessing systems are designed to imitate the human eye, but are merely approximations of what the eye can do.

Some conventional image processing systems acquire images from an image acquisition unit, such as a camera, which produces each image in a raster scan format. The video signal is typically forwarded to a pipeline of neighborhood processors, such as convolvers, and integral processors such as histogram and fast Fourier transformers. In addition, the preprocessors typically generate their outputs in a raster scan format so that one preprocessor can directly feed into the next one. The approximate AGC algorithm in image processing is a special case of neighborhood transforms. A neighborhood transform is an image mapping operation where each pixel value of the output image is a function of the value of the corresponding pixel of the input image and the pixels in a local region surrounding it. Neighborhood transforms can use neighborhoods of arbitrary size, but most are of a specific size such as a cascaded series of transforms using 3×3 neighborhoods. These 3×3 neighborhoods involve only the eight nearest neighbors surrounding a given pixel to be processed.

Another special case of neighborhood transforms are convolutions. Usually these are linear filters, such as High-Pass filters that enhance contours and border lines within the processed pictures, or Low-Pass filters whose common task is to reduce noise. In general, linear convolutions are rather limited in performance, and are considered as heavy time and memory consumers.

Homomorphic filters, such as described in U.S. Pat. No. 5,247,366, have been introduced to signal processing during the last decade. These are non-linear processors that essentially divide every sample of the original signal by the corresponding sample of Low-Pass filtered version of the original signal. Homomorphic filters can achieve bounded amounts of dynamic range reduction, however they are cumbersome to implement, potentially sensitive to errors, and highly demanding in computation time and hardware.

The concept of causal feedback AGC has been known and used for many years in communication and signal conditioning. There, a causal averaging is commonly utilized by some type of Low-Pass Filter or an Integrator, that merely slows down and limits the signal rate of change in time. This in turn, results in time-dependent AGC devices the response of which to video signals would necessarily depend on the direction in which the photographed scenery had been scanned by the camera—a very unfavorable phenomenon.

In a non-causal signal processing system operating in real time, the procely higher values of surrounding output samples, of which some may have not yet been processed. This leads to an iterative, or recurrent process, where a repetitive application of a feed-forward AGC is used, in which the output in every repetition depends on the output in the preceding repetition, so that it is not an explicit function of the input only. This type of repetitive algorithm may eventually converge to a value nearly identical with that one would obtain from a feedback AGC. Unfortunately, the iterative process requires a great deal of processing time and memory, thus limiting its use in real time and increasing its cost.

Image processing apparatus of the general type discussed above is described, e.g., in WO 90/01750, WO 90/01844 and WO 90/01845.

SUMMARY OF THE INVENTION

Therefore, what is needed in the signal processing field is an improved signal processor that approximates the non-causal feedback AGC model for the natural process that takes place in biological sensors, but is not constrained by a time consuming iterative algorithm and does not require a large memory, so that the system can inexpensively operate in real time.

It is an object of the present invention to provide such an improved signal processor.

It is another object of the invention to provide a device that is not constrained by a time consuming iterative algorithm and does not require a large memory.

It is a further object of the invention to provide a processor that can be operated inexpensively in real time.

Other objects of the invention will become apparent as the description proceeds.

The real time equalizer-enhancer apparatus according to the invention comprises:
- a plurality of analog multipliers having one input connected to the sampled input signal, and the other input connected to the output of an operational amplifier;
- at least one operational amplifier provided with feedback resistor, the output of which is connected to the input of one or more of the said plurality of analog multipliers, and the input of which is connected to one or more summing resistor; and
- a plurality of summing resistors connected between the output of each of the said analog multipliers and the input of the operational amplifier;

means being provided to combine the outputs of the said plurality of analog multipliers according to a predetermined combination rule, means also being provided to subtract said combination of multipliers outputs from prescribed constant bias values, and to feed the results back into the inputs of the analog multipliers.

According to a preferred embodiment of the invention, the real time equalizer-enhancer apparatus comprises:
- a sampling switch for feeding the samples of the input signal into a plurality of analog delay lines, either with or without taps;
- a plurality of such analog delay lines, connected at one end to the said sampling switch, and at the other end to a plurality of analog multipliers;
- a plurality of analog multipliers having one input connected to the said delay lines, and the other input connected to the output of an operational amplifier;
- a plurality of operational amplifiers provided with feedback resistor, each operational amplifier output being connected to at least one analog multiplier, wherein the input of each operational amplifier is connected to several analog multipliers via one or more summing resistors;
- a plurality of summing resistors connected between the output of each of the said analog multipliers and the input of the operational amplifiers; and
- a summing amplifier to combine the outputs of the said plurality of analog multipliers, to yield the output signal of the real time equalizer-enhancer apparatus.

According to another preferred embodiment of the invention, the real time equalizer-enhancer apparatus comprises:
- a plurality of analog sample-hold elements, for feeding the samples of the input signal in cyclic order to a plurality of analog multipliers;
- plurality of analog multipliers having one input connected to the said sample-hold elements, and the other input connected to the output of an operational amplifier;
- one operational amplifier provided with feedback resistor, the said operational amplifier input being connected to each of the said plurality of analog multipliers through summing resistors, wherein the output of the operational amplifier is connected to the input of all analog multipliers;
- a plurality of summing resistors connected between the output of each of the said analog multipliers and the input of the operational amplifier;
- a plurality of analog switches each switch being connected at the output of one of the said analog multipliers, to feed the output signal samples to memory buffer means.

According to yet another preferred embodiment of the present invention, the real time equalizer-enhancer apparatus comprises:
- a plurality of Analog to Digital Converters (ADCs) for sampling and converting the input signal into sequences of digital words, and feeding said words into a Digital Signal Processor (DSP);
- a DSP, comprised of a plurality of registers, a plurality of adders/subtractors, and a plurality of multipliers/dividers. Said DSP operates non iteratively and non recursively, namely it computes the exact output of the non causal feedback AGC of the present invention as a function of the input signal only, in a single computation cycle.
- a Digital to Analog Converter (DAC) for converting the output of said DSP into an analog signal.

As will be appreciated by a skilled person, the device of the present invention can be dimensioned in many different ways. However, a preferred device according to the present invention is a device wherein the components are dimensioned such that an input of equal steps evenly spaced, each fed thereto, results in filter response in the shape of flat values arranged along a logarithmic curve which averages them, which logarithmic curve is asymptotic to a prescribed constant level regardless of the input signal level. Said output flat levels are separated by transitional zones in the form of doublets, each of which is composed of a negative peak that appears next to the lower side of the step and a positive peak appearing next to the higher side of the step.

Also encompassed by the invention is a signal processing apparatus comprising:
- an analog sample and storage device for sampling and storing a sampled-data representation of an input signal;
- an analog sample and storage device for sampling and storing a sampled-data representation of an output signal;
- a real time equalizer-enhancer apparatus as described above.

All the above and other characteristics and advantages of the invention will be better understood through the following illustrative and non-limitative description of preferred embodiments.

DETAILED DESCRIPTION OF PREFERRED EMBODIMENTS

Figure 1:
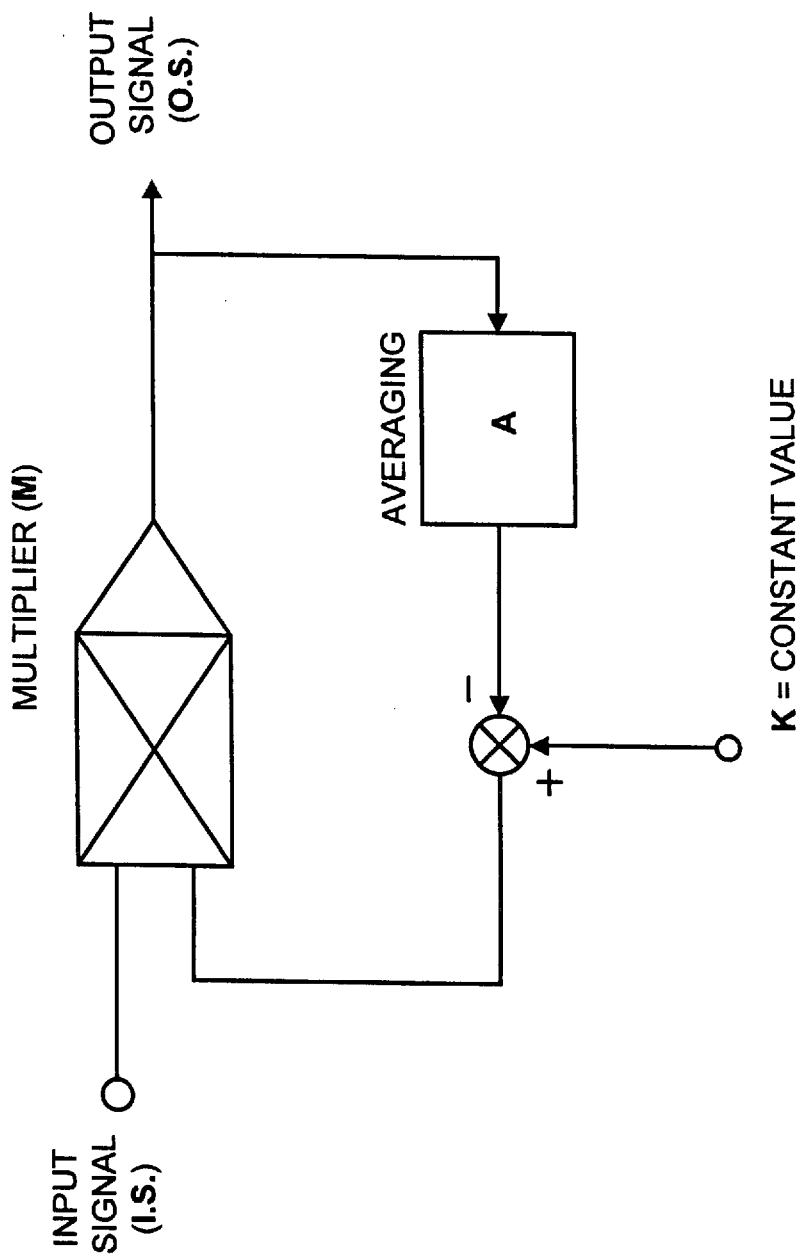
FIG. 1 is a block diagram of the prior art model feedback automatic gain control processor. In this model the output signal is a product of the input signal, and the difference of a prescribed constant and a non-causal average of the output signal.
Figure 2:
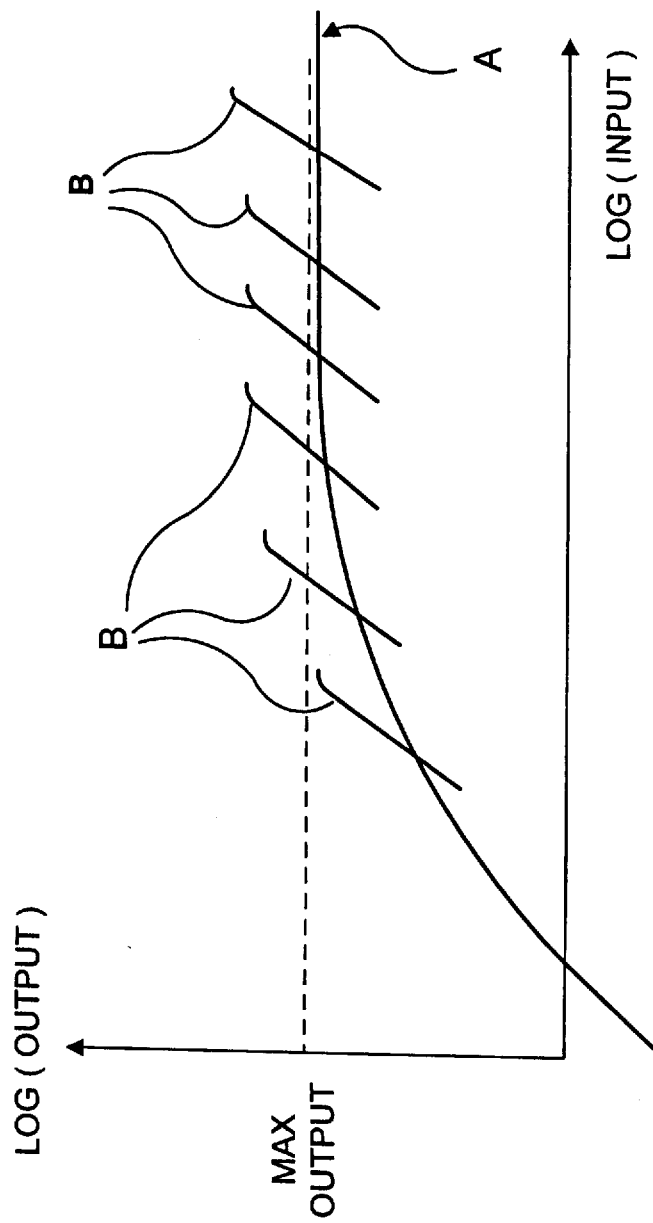
FIG. 2 is a qualitative description of the prior art feedback AGC model transmissions, wherein Curve A: The average level transmission; and Curves B: The local variations transmission.
Figure 3:
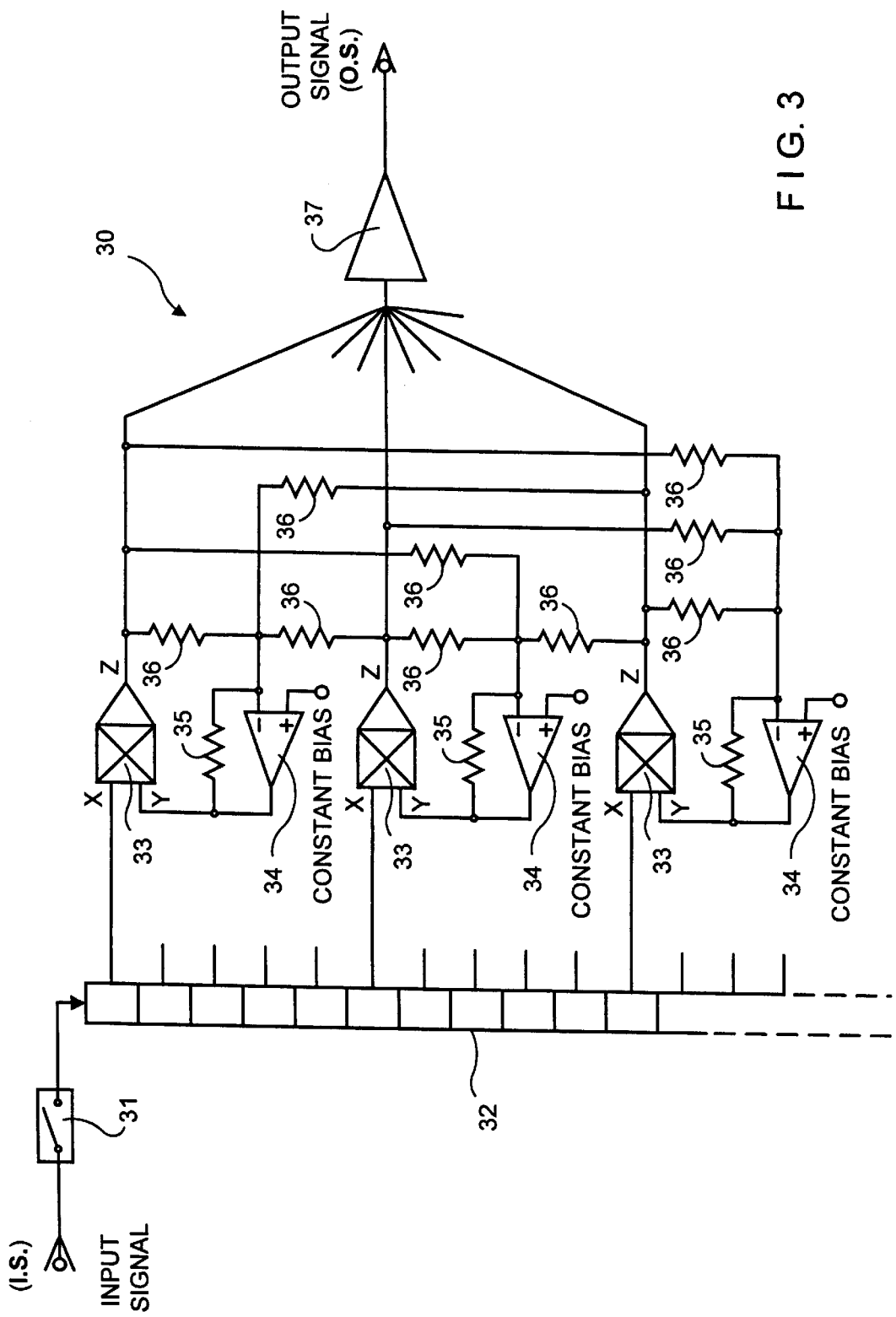
FIG. 3 is a diagram of a signal processing apparatus having an automatic gain control circuit that uses non-causal averaging in the feedback path.

Illustrated in FIG. 3 is a real time equalizer-enhancer apparatus 30 which is illustrative of an application of the present invention. Other applications include commercial television, cable television, satellite television, video cameras, medical imaging devices, satellite imaging devices, high-fidelity audio amplifiers, video and audio recorders, video and audio communication links and storages, and the like. The real time equalizer-enhancer apparatus 30 is based on the feedback automatic gain control (AGC) concept that is mechanized by the use of non-causal, or double-sided averaging kernels as explained below.

The equalizer-enhancer 30 includes a sampling switch 31 that feeds the samples of the input signal into a multi-tap analog delay line 32. The length of the delay line is arbitrary, however a sufficiently adequate minimum number of stages is 2. The delay of each stage of the delay line depends on the specific application to be utilized. For horizontal filtering only, of commercial Television Video, the stage delay should be in the order of 70 to 100 nano seconds, which approximately resembles the time duration of a single pixel. For this type of application, an example for appropriate delay line would be a product of either series 2211 or series 2214, manufactured by Data Delay Devices Inc. For vertical filtering only of the same type of signals, the stage delay must be exactly equal to the time duration of a single Television line which is in the order of 64 micro seconds. This type of synchronous delay can be performed by Charge Coupled Devices (CCD) type of analog delay lines, such as CXL 5001P or CXL 5001M, 1H CMOS-CCD, manufactured by Sony Corp., Japan. For 2-dimensional filtering of video signals, the two types of delay lines should be alternately connected in series. Each tap of the delay line is connected to an input marked x of an analog multiplier 33. The nominal function of each one of the multipliers 33 is z=xy, where y is the other input to the multiplier and z is the multiplier output. An example for an analog multiplier is AD-834, manufactured by Analog Devices Inc.

The input marked by y of each multiplier is connected to the output of an operational amplifier 34, with feedback resistors 35 and input summing resistors 36. The input resistors 36 are connected to the multipliers outputs and perform a non-causal weighted averaging of the outputs. The task of the operational amplifiers is to subtract the averaged output from a prescribed constant, and to feed the result back to the multipliers inputs. The various weights of the averaging in amplifiers 34 are determined by the quotients: (value of resistor 35)/(value of resistor 36).

Each pair of multipliers define two weighted feedback paths. The weights can be determined in many ways. One useful way to prescribe a weight for a given path, is to have it proportional to some exponent of the number of taps that separate between the inputs of the two multipliers that define the corresponding feedback path. An important special case of the exponential weighting is the case where the exponent basis is unity (one). In this case all the weights are equal and the average is the common arithmetic average. The outputs of the analog multipliers 33 are further connected to a summing amplifier 37 that performs a linear combination of the multipliers outputs. The output of amplifier 37 constitutes the output signal of apparatus 30.

Figure 4:
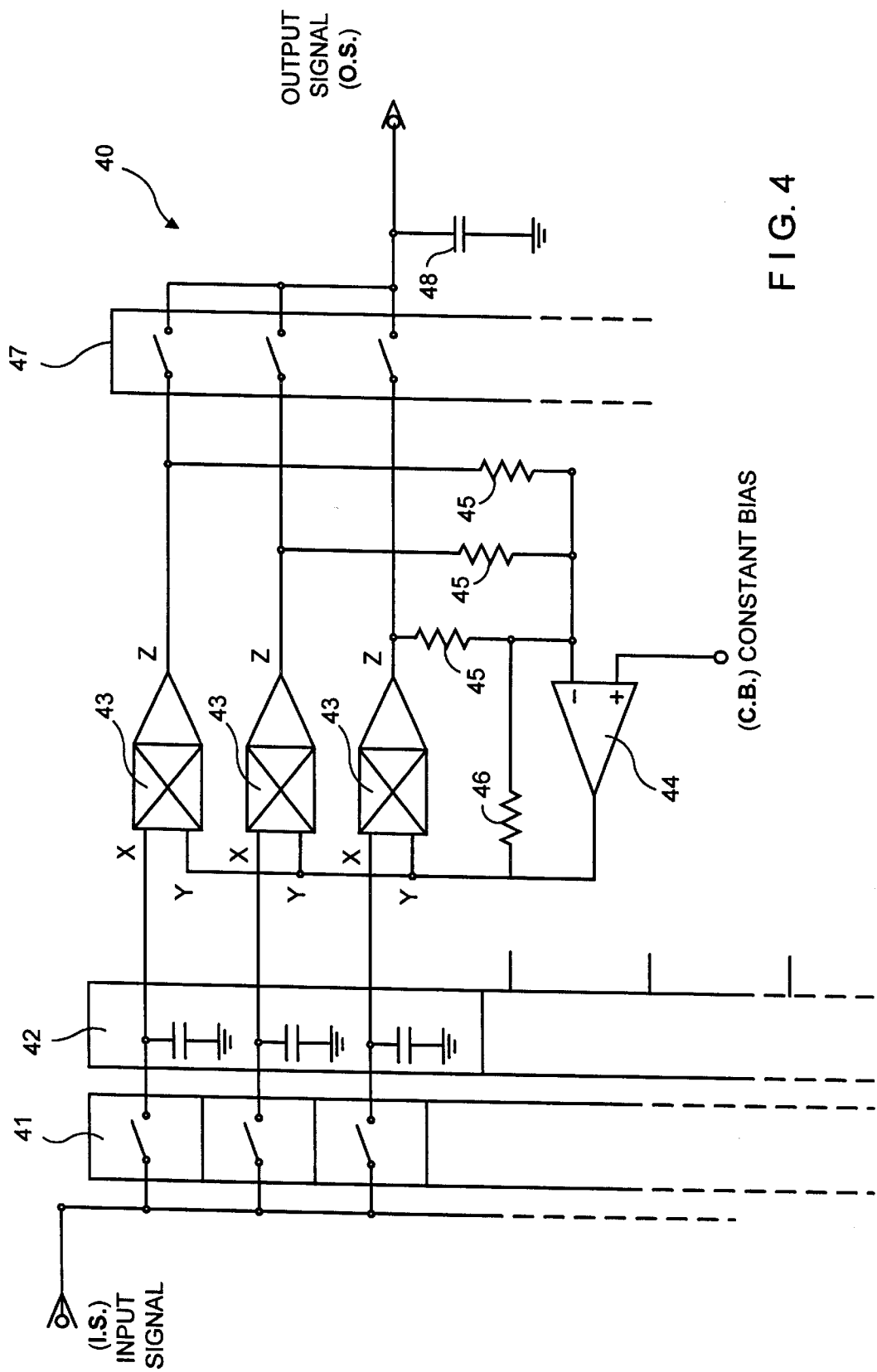
FIG. 4 is a simplified version of the apparatus of FIG. 3.

In some embodiments it is possible to use simplified portions of the present equalizer-enhancer. FIG. 4 illustrates a simplified equalizer-enhancer apparatus 40, where the tapped delay line 32 of FIG. 3 has been replaced by a set of analog sample-hold elements 42. The switches 41 of the sample-hold cells make their contact each one at a time in a cyclic order, such that at each sampling instant the cell that holds the oldest data is being updated with the newest data. A possible example for the sample-hold elements is CLC940, manufactured by Comlinear Corp. The outputs of the sample-holds are connected to the inputs of a plurality of analog multipliers 43, in an arrangement similar to that of FIG. 3. Using a unity averaging exponent, a single operational amplifier 44, whose input resistors 45 are all identical in value can be used.

The output signal of the equalizer-enhancer apparatus 40 is composed of the multipliers outputs, sampled at a cyclic order. This is performed by the plurality of analog switches 47, that feed the signals samples to an output memory buffer 48.

Figure 5:
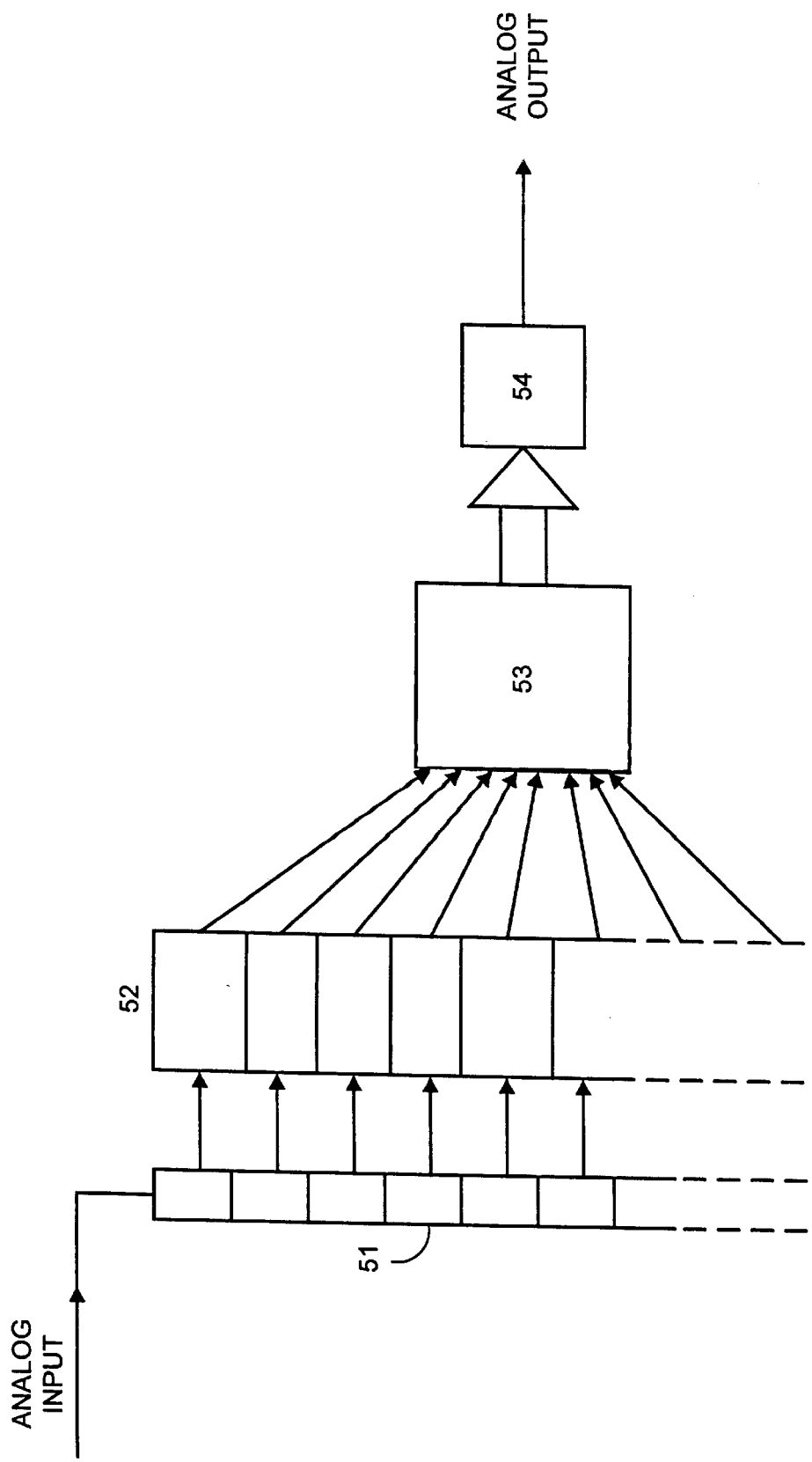
FIG. 5 is a diagram of a signal processing apparatus whose function is identical to that of the apparatus of FIG. 3, wherein the output of the AGC filter is computed by a digital processor.

In a semi-digital embodiment according to FIG. 5, the outputs of the delay lines 51 are converted into digital words by the plurality of Analog to Digital Converters 52. Said digital words, that represent a given neighborhood of the input signal are fed into a digital processor 53. Said digital processor is equipped with all the registers, data busses, adders/subtractors, multipliers/dividers, as well as timing generators and appropriate commands—either in software or in hardware, so as it is capable of computing the output of a non causal feedback AGC model non iteratively, as an explicit function of the input signal only.

The execution of this function requires only the four basic arithmetic operations and can be performed by most of the existing digital processors, such as the TMS-320/C30, manufactured by Texas Instruments Inc. Alternatively, the computations involved can be carried out by a Central Processing Unit (CPU) of any general-purpose host computer, such as the IBM/PC or alike. In the semi digital embodiment, the processor output is finally converted back into an analog signal by the Digital to Analog Converter (DAC) 54 of FIG. 5.

Figure 6:
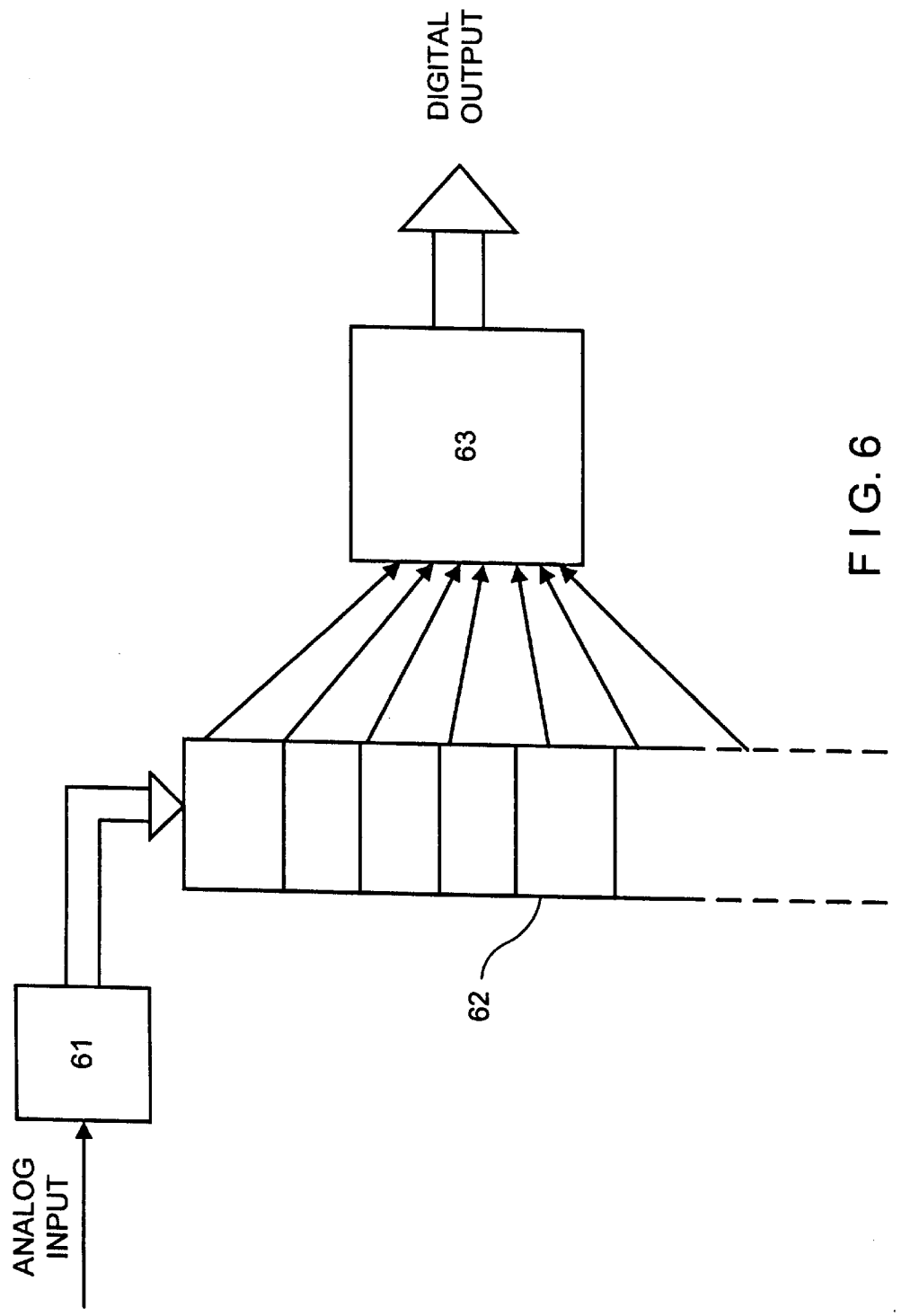
FIG. 6 is a diagram of a signal processing apparatus whose function is identical to that of the apparatus of FIG. 5, wherein the analog sample-hold elements and analog delay lines are respectively replaced by analog to digital converters and digital memory buffers/shift registers.

In a fully digital embodiment of the present invention according to FIG. 6, the input signal is sampled and converted into a sequence of digital words by the Analog to Digital Converter (ADC) 61, said words are fed into a plurality of digital shift registers, or memory buffers, 62. The outputs of the shift registers/memory buffers are fed into a digital processor 63, said processor computes the output of the non causal feedback AGC model non iteratively, as an explicit function of the input samples only.

Figure 7:
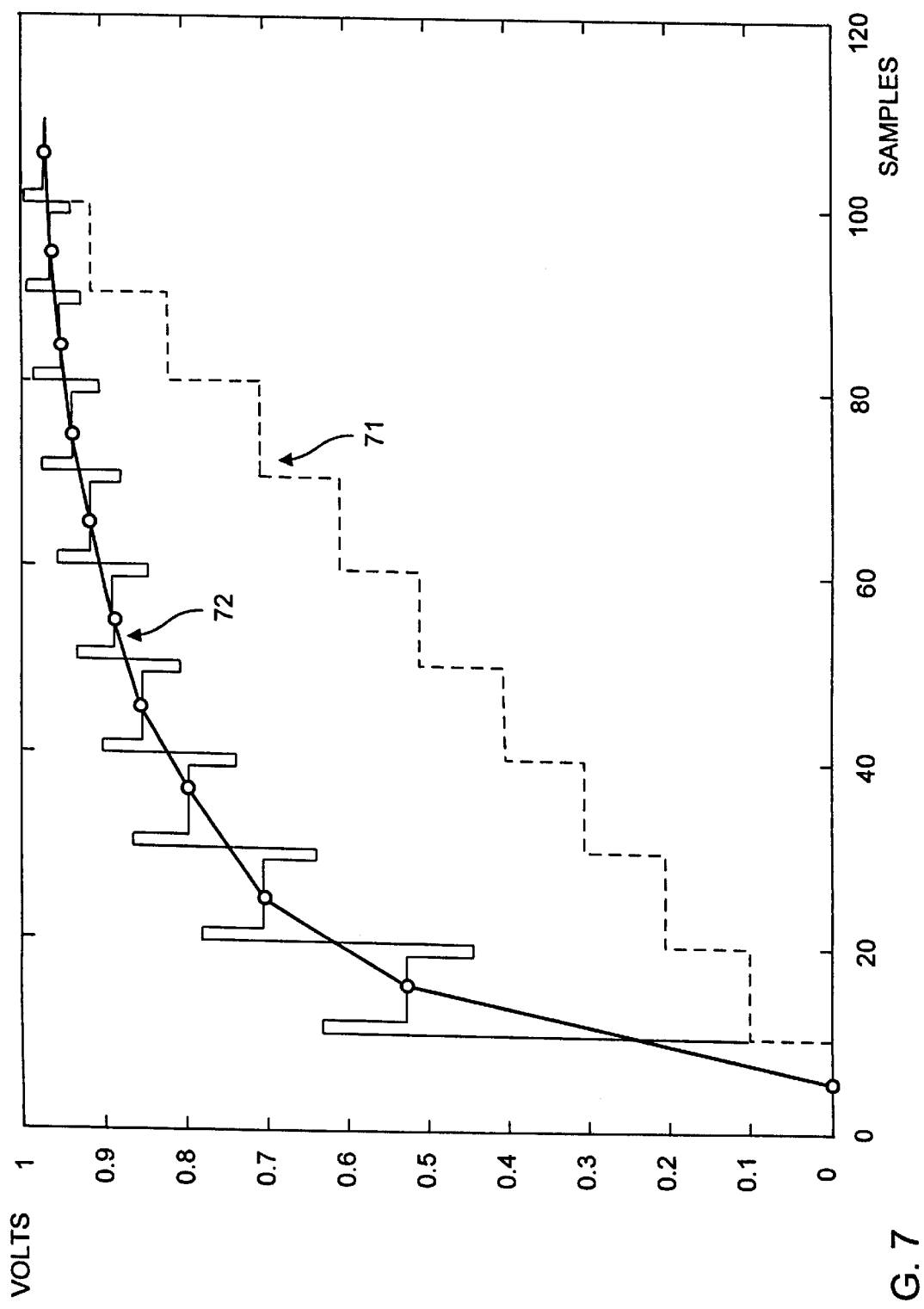
FIG. 7 is a quantitative example of the response of some embodiments of the present non causal AGC invention to input signal that is composed of equal steps, evenly spaced.

In order to demonstrate the performance of the present equalization-enhancement device in a quantitative manner, a synthetic unidimensional stair-case input signal have been processed by an exact computer model of the equalizer-enhancer. The input signal is Graph 71 in FIG. 7. It consists of a series of 110 samples whose intensities are arranged in ten equal steps of 0.1 Volts each, covering together the range between 0 Volts and 1 Volt, and evenly spaced along the line of samples. The response of the filter to this input signal is given in Graph 72 of FIG. 7. It consists of a series of horizontal flat zones, separated by a series of transitional zones. Each of the transitional zones is a doublet, composed of a negative peak followed by a positive peak. The flat zones are the filter responses to the corresponding horizontal segments of the input signal. The doublets of negative and positive peaks are the device responses to the corresponding transitions that separate between the stairs of the input signal.

Figure 8:
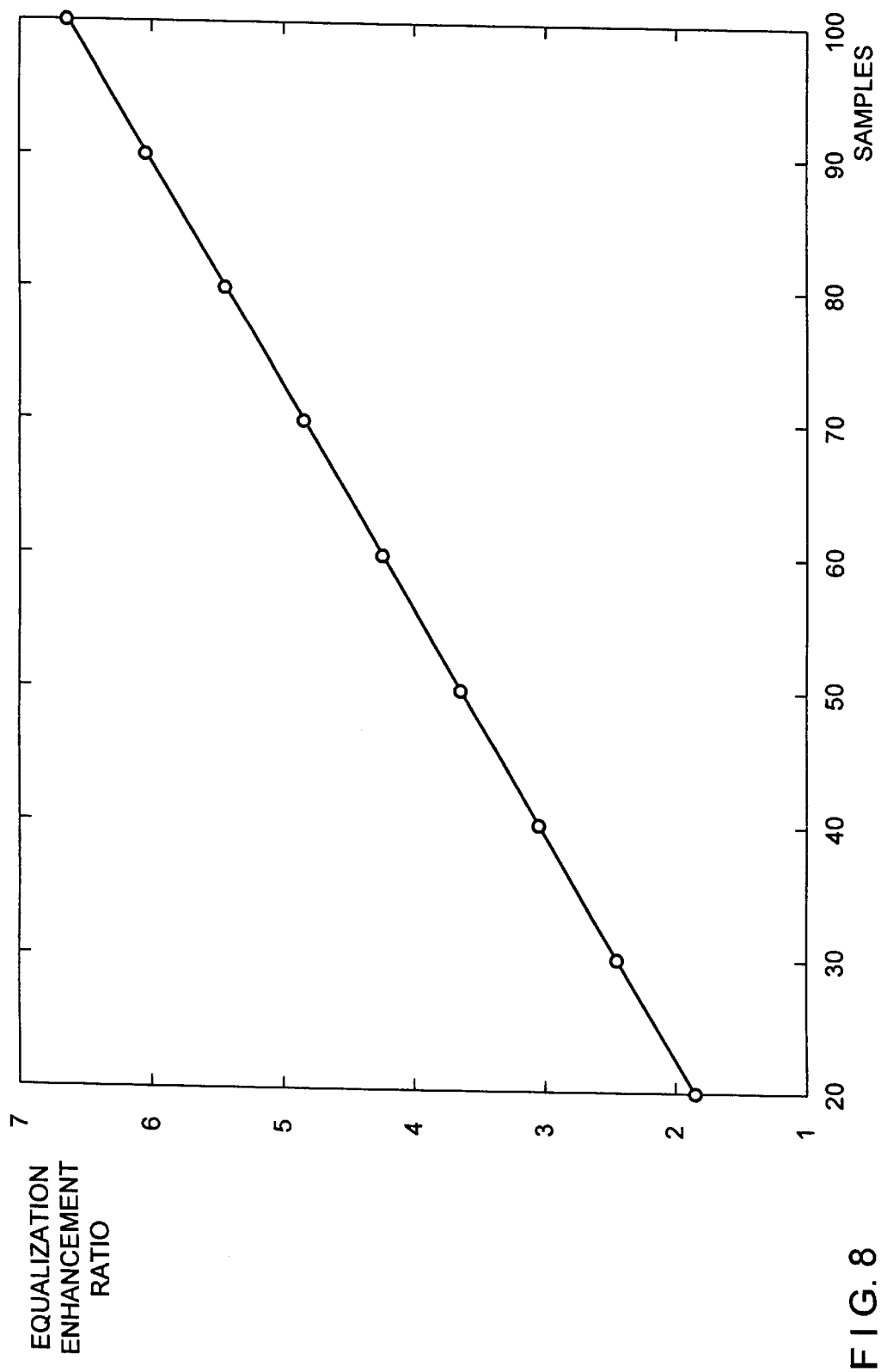
FIG. 8 is a quantitative description of the equalization-enhancement factor which is calculated from the response exhibited in FIG. 7.

The equalization property of the present device can be appreciated from the values of the horizontal segments of the output signal. Those values are arranged on a logarithmic curve that can never exceed the value of 1, no matter how large the average level of the input signal is. This implies that the dynamic range compression ability of the present device per the average input is practically unlimited. The enhancement property can be measured if per each step of the output signal a quotient is calculated, which is the ratio between the difference of the positive and negative peaks of the doublet, and the difference between the two horizontal levels that are adjacent to the said doublet on both sides. In FIG. 8, the values of these quotients, as calculated from Graph 72 of FIG. 7, were plotted per all the steps between sample 20 and sample 100. One can appreciate the fact that the equalization-enhancement quotient, which is the ratio between the device response to local changes and its response to the average, is in fact growing linearly with the average of the input signal.

Graph 72 also shows a clear evidence to the non causal character of the present invention. Had the stepped input signal been introduced to the filter along the time axis, with the steps going either upward or downward in time, in either case half of each of the transitional doublets would have precede the corresponding step in time. Conversely, the response of any traditional causal feedback AGC, would exhibit only an overshoot following a positive input step, and only an undershoot following a negative input step.

All the above description and examples of preferred embodiments have been provided for the purpose of illustration, and are not intended to limit the invention in any way. As will be appreciated by the skilled person, many different arrangements can be provided for the equalizer-enhancer apparatus of the invention, and many different parts, combinations and uses can be devised, all without exceeding the scope of the invention.

I claim:

1. A real time equalizer-enhancer apparatus, comprising:
   a plurality of analog multipliers having one input connected to the sampled input signal, and the other input connected to the output of an operational amplifier;
   at least one operational amplifier provided with feedback resistor, the output of which is connected to the input of one or more of the said plurality of analog multipliers, and the input of which is connected to one or more summing resistor; and
   a plurality of summing resistors connected between the output of each of the said analog multipliers and the input of the operational amplifier;
   means being provided to combine the outputs of the said plurality of analog multipliers according to a predetermined combination rule, means also being provided to subtract said combination of multipliers outputs from prescribed constant bias values, and to feed the results back into the inputs of the analog multipliers.

2. A real time equalizer-enhancer apparatus according to claim 1, comprising:
   a sampling switch for feeding the samples of the input signal into a plurality of analog delay lines, either with or without taps;
   a plurality of such analog delay lines, connected at one end to the said sampling switch, and at the other end to a plurality of analog multipliers;
   a plurality of analog multipliers having one input connected to the said delay lines, and the other input connected to the output of an operational amplifier;
   a plurality of operational amplifiers provided with feedback resistor, each operational amplifier output being connected to at least one analog multiplier, wherein the input of each operational amplifier is connected to several analog multipliers via one or more summing resistors;
   a plurality of summing resistors connected between the output of each of the said analog multipliers and the input of the operational amplifiers; and
   a summing amplifier to combine the outputs of the said plurality of analog multipliers, to yield the output signal of the real time equalizer-enhancer apparatus.

3. A real time equalizer-enhancer apparatus according to claim 1, comprising:
   a plurality of sample-hold elements, for feeding the samples of the input signal in cyclic order to a plurality of analog multipliers;
   a plurality of analog multipliers having one input connected to the said sample-hold elements, and the other input connected to the output of an operational amplifier;
   one operational amplifier provided with feedback resistor, the said operational amplifier being connected to each of the said plurality of analog multipliers, wherein the output of the operational amplifier is connected to the input of all analog multipliers, and the input of which is connected to a plurality of summing resistors;
   a plurality of summing resistors connected between the output of each of the said analog multipliers and the input of the operational amplifier;
   a plurality of analog switches each switch being connected at the output of one of the said analog multipliers, to feed the signal samples to memory buffer means.

4. A device according to claim 1, wherein the components thereof are dimensioned such that an input of equal steps evenly spaced, each fed thereto, results in filter response in the shape of flat values arranged along a logarithmic curve which averages them, which logarithmic curve is asymptotic to a prescribed constant level regardless of the input signal level, said output flat levels being separated by transitional zones in the form of doublets, each of which is composed of a negative peak that appears next to the lower side of the step and a positive peak appearing next to the higher side of the step.

5. A signal processing apparatus comprising:
   an analog sample and storage device for sampling and storing a sampled-data representation of an input signal;

an analog sample and storage device for sampling and storing a sampled-data representation of an output signal;

a real time equalizer-enhancer apparatus according to claim 1.

6. Apparatus according to claim 5, wherein said sample and storage devices are operating in a cyclic order.

7. Apparatus according to claim 5, wherein said sample and storage devices comprise analog switches.

8. Apparatus according to claim 5, wherein said sample and storage devices comprise analog memories.

9. Apparatus according to claim 8, wherein said analog memories comprise analog delay lines.

10. Apparatus according to claim 8, wherein said analog memories comprise Charged Coupled Devices (CCD) delay lines.

* * * * *